United States Patent [19]
Gusinov et al.

[11] Patent Number: 5,424,510
[45] Date of Patent: Jun. 13, 1995

[54] CIRCUIT AND METHOD OF PROVIDING THERMAL COMPENSATION FOR A TRANSISTOR TO MINIMIZE OFFSET VOLTAGE DUE TO SELF-HEATING OF ASSOCIATED DEVICES

[75] Inventors: Alex Gusinov, Brighton; A. Paul Brokaw, Burlington, both of Mass.; Douglas W. Babcock, Manchester, N.H.; Lewis Counts, Lexington, Mass.; Lawrence DeVito, Tewksbury, Mass.; Robert A. Duris, Hubbardston, Mass.; Scott Wurcer, Cambridge, Mass.

[73] Assignee: Analog Devices Inc., Norwood, Mass.

[21] Appl. No.: 113,397

[22] Filed: Aug. 27, 1993

[51] Int. Cl.[6] ............................................. H05B 3/02
[52] U.S. Cl. .................................................... 219/209
[58] Field of Search ................................. 219/209, 210

[56] References Cited
U.S. PATENT DOCUMENTS

| | | | |
|---|---|---|---|
| 3,308,271 | 3/1967 | Hilbiber | 219/210 |
| 3,320,407 | 5/1967 | Holmes | 219/210 |
| 3,393,870 | 7/1968 | Jeffrey | 219/210 |
| 3,887,785 | 6/1975 | Ahlport | 219/209 |
| 4,497,998 | 2/1985 | West | 219/210 |

OTHER PUBLICATIONS

Simpkins, Shaun and Winthrop Gross, "Cascomp Feedforward Error Correction in High Speed Amplifier Design", *IEEE Journal of Solid-State Circuits*, vol. sc-18, No. 6, Dec. 1983, pp. 762-764.

*Primary Examiner*—Teresa J. Walberg
*Attorney, Agent, or Firm*—Samuels, Gauthier & Stevens

[57] ABSTRACT

A circuit for varying the temperature of a first bipolar transistor in order to thermally compensate for self-heating effects of an associated device in a common signal path with the first transistor, the first transistor being configured within an isolated collector region. The circuit includes a second bipolar transistor provided within the isolated collector region and thermally coupled to the first transistor, the second transistor operable for providing heat to the first transistor to alter the temperature to a predetermined level, thus changing the operational voltage characteristics of the first transistor so as to minimize shifts in offset voltage.

31 Claims, 8 Drawing Sheets

CIRCUIT AND METHOD OF PROVIDING THERMAL COMPENSATION FOR A TRANSISTOR TO MINIMIZE OFFSET VOLTAGE DUE TO SELF-HEATING OF ASSOCIATED DEVICES

BACKGROUND OF THE INVENTION

The invention relates to a circuit and method which provide thermal compensation for associated devices in a signal path in order to minimize shifts in offset voltages due to self-heating.

Conventional bipolar transistors operate approximately in accordance with the following equation:

$$i_c \approx i_e - i_b \approx i_s (e^{\frac{qV_{BE}}{kT}} - 1) \quad (1)$$

where $i_c$, $i_b$, and $i_e$ are the collector, base, and emitter currents, respectively, $i_s$ is the saturation current for the transistor with predetermined geometry and doping, $V_{BE}$ is the base-emitter voltage, and q/kT is the reciprocal of the thermal voltage. Accordingly, solving for $V_{BE}$ results as follows:

$$V_{BE} \approx \frac{kT}{q} \ln\left(\frac{i_c}{i_s}\right) \quad (2)$$

where $i_s = i_d e^{(-qE_{go}/kT)}$, $i_d$ being a predetermined constant and $E_{go}$ being a constant approximately equal to 1.2V.

Substituting $i_s$ into equation (1) and simplifying results in the following:

$$V_{BE} = E_{go} - \frac{kT}{q} \ln\left(\frac{i_d}{i_c}\right) \quad (3)$$

With respect to the above equations, it will be appreciated that for a given transistor, variances in temperature result in opposing changes in the base-emitter voltage. For example, for an increase in temperature in the transistor, the base-emitter voltage required to activate the transistor decreases. This relationship becomes critical when utilizing such transistors in matched pair configurations.

Matched pairs of transistors are commonly utilized as differential pairs in gain block circuits such as operational amplifiers and comparators, where a differential voltage is used as an input. The predetermined input offset voltage $V_{os}$ (the negative of the input voltage which must be applied across the input terminals of the pair in order to obtain zero output voltage) for such devices is ideally 0V, and in practice is a few millivolts. When the differential pair is used primarily for large signal operation, the small offset voltage is acceptable. When used in applications where a small input voltage represents some measured quantity as in a converter, meter, or measuring device, any nonzero input offset voltage can result in substantial error.

Offset voltage errors typically occur due to initial matching differences and to temperature drift in component parameters. Temperature drift refers to the change in input offset voltage resulting from change in temperature. The drift components may be compensated by introducing complementary temperature coefficients within the circuit. A common source of drift is local heating of diode junctions and resistive components having non-zero temperature coefficients.

Devices which are fabricated in dielectrically isolated processes exhibit much higher thermal resistances of individual devices than junction isolated processes, thus there is an even greater need for thermal compensation to prevent shifts in offset voltages due to self-heating. Full dielectric isolation is achieved by using silicon-on-silicon insulator wafers and trenching the silicon layer.

A cross-section of an exemplary NPN transistor 10 fabricated using an exemplary dielectrically isolated process is shown in FIG. 1. Initially, a silicon substrate 11 is subjected to an anisotropic etch which removes all the silicon in a specified area, and selectively stops at a buried silicon oxide layer 14 to form a trench 16. The trench is preferably 2 um wide and approximately 6 um deep. The trench 16 is then filled with polysilicon and oxide which eventually form a polysilicon barrier 18 and silicon dioxide barrier 20 to form a dielectrically isolated region 13 after doping.

The silicon substrate 11 consists of a p-type epitaxial layer which is counterdoped with a heavily doped n+-type buried layer 22 and a lightly doped n-type diffusion 24 from the epitaxial layer surface (PNP devices are fabricated using p-type epitaxial layer with a heavily doped p+-type buried layer). The upward diffusion of the buried layer 22 merges with the downward diffusion of the surface implant 24 and reverses the conductivity type of the epitaxial layer. The bases of the NPN and PNP (not shown) are formed by boron and phosphorus implants, respectively, or any desired p-type base diffusion 26. An extrinsic p-type base diffusion 28 is used to make an ohmic contact to the metallic base contact 27. A n-type diffusion 30, preferably arsenic, is implanted (boron for P-emitters) in the emitter material, preferably polysilicon. Deep contact diffusions 32 (plugs) are used for collector contacts in both NPN and PNP transistors. The collector plugs 32 help reduce collector (Rc) series resistance. An emitter diffusion 33 is also provided inside the plug and the extrinsic part of the bases to form ohmic contacts to these areas. Metallic contacts for the base 27, emitter 31, and collector 34 are formed using a conventional process.

Devices fabricated with such processes exhibit enhanced thermal isolation, and therefore are more susceptible to shifts in offset voltage due to self-heating during operation. Conventional methods for compensating for these self-heating effects include utilizing excessively large devices, degenerating and cascoding current mirrors, and running the transistors at lower currents. The use of excessively large devices have associated area and speed drawbacks. Degenerating and cascoding has a headroom disadvantage and can only be used with current mirrors, and not with differential pairs, to decrease self-heating effects. Operating transistors at lower currents has an associated device speed liability.

SUMMARY OF THE INVENTION

It is therefore an object of the present invention to provide thermal compensation for self-heating effects of associated devices.

It is a further object of the invention to vary the temperature of a transistor in order to modify the operational electrical charactersistics of the transistor.

Accordingly, the present invention is a circuit and method for varying the temperature of a transistor configured within an isolated electrical region in order to thermally compensate for self-heating effects of an associated device in a common signal path with the transistor. The circuit includes heat generating means, provided separately from the transistor within said isolated electrical region and adapted to be thermally coupled to the transistor, for generating heat which modifies the temperature and in turn the operational electrical characteristics of the transistor so as to minimize shifts in offset voltage.

In one embodiment of the invention, the transistor is a first bipolar transistor configured within an isolated collector region, and the heating means is a second bipolar transistor provided within the isolated collector region and thermally coupled to the first transistor. The second transistor is operable for providing heat to said first transistor so as to alter the temperature to a predetermined level, thus changing said operational voltage characteristics of the first transistor so as to minimize shifts in offset voltage.

DETAILED DESCRIPTION OF THE ILLUSTRATED EMBODIMENTS

Figure 2:
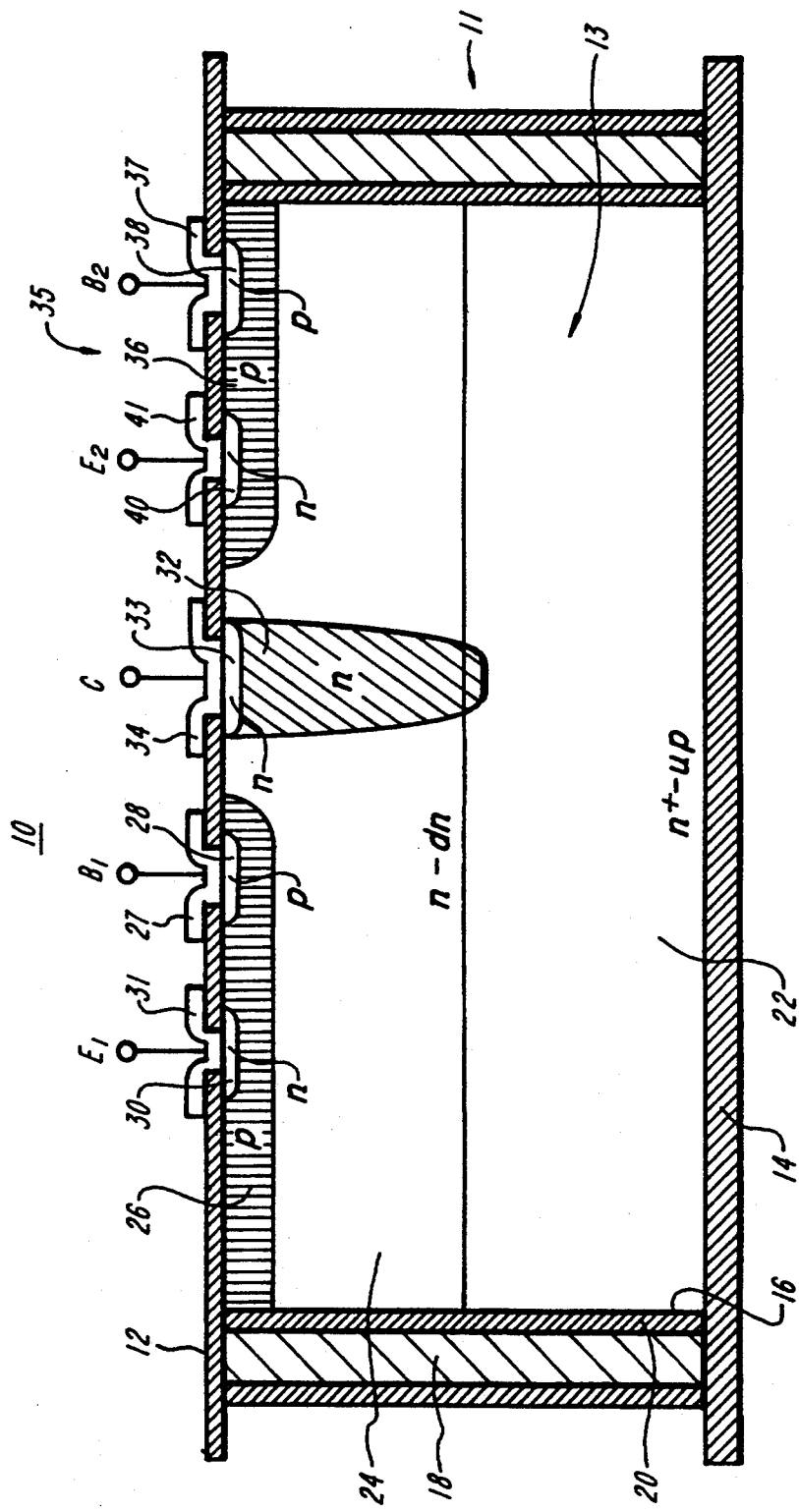
FIG. 2 shows one embodiment of the present invention utilized in connection with an NPN transistor fabricated in a dielectrically process.

With reference now to FIG. 2, a cross-section view of the present invention is shown as including a second base-emitter region 35 implemented with a NPN transistor 10 fabricated in a dielectrically isolated process. The second base-emitter region 35 is primarily configured with a p-type base diffusion 36 and a n-type emitter diffusion 40 with associated metallic contact 41. An extrinsic p-type base diffusion 38 coupled to metallic contact 37 is also used to make an ohmic contact to the base. The base-emitter region 35 utilizes the collector region 32 as a common collector to effectively form a second transistor within the dielectrically isolated region 13. The second transistor will preferably serve as a heating transistor as will be described hereinafter.

Figure 1:
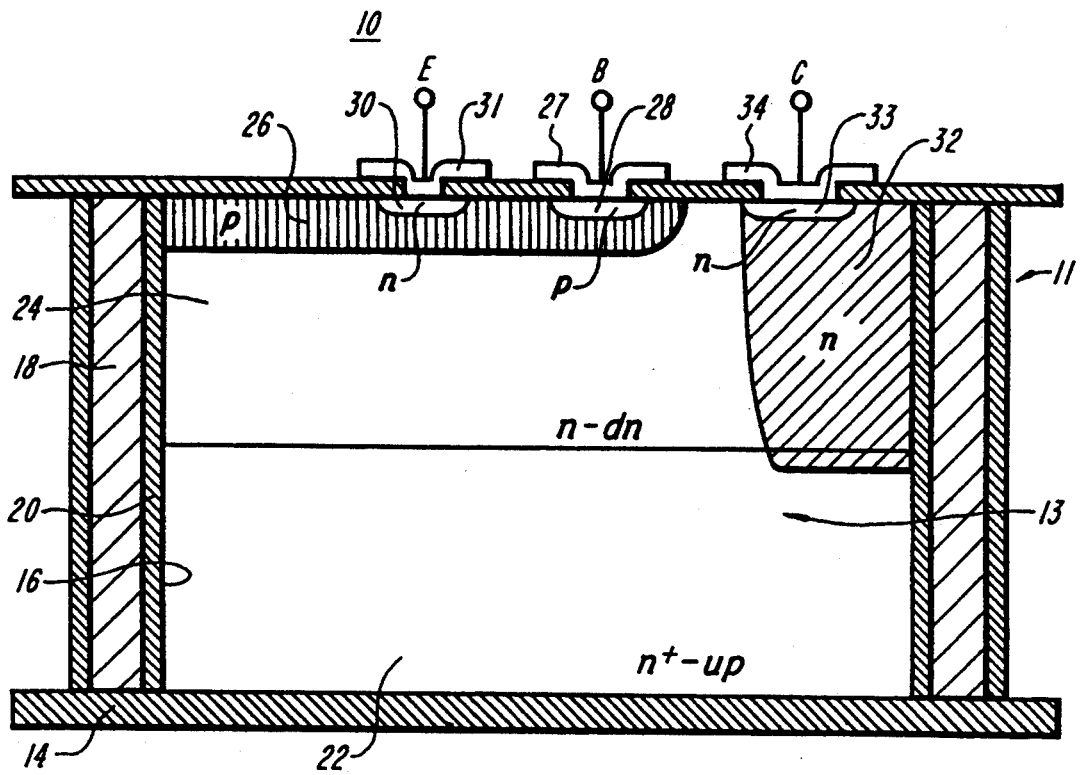
FIG. 1 shows a cross-section view of an NPN transistor fabricated in a dielectrically isolated process.
Figure 3:
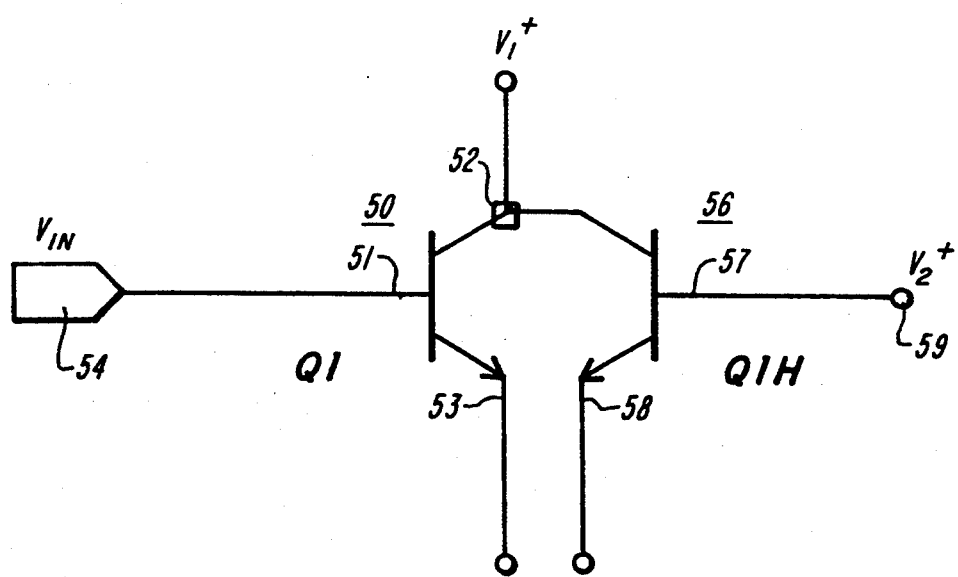
FIG. 3 shows a circuit schematic diagram of an embodiment of the present invention.

FIG. 3 shows a circuit schematic diagram of the present invention which includes a bipolar transistor 50, having base 51 coupled to input signal source 54, collector 52, and emitter 53; and a second bipolar transistor 56 having base 57 coupled to signal source 59, emitter 58, and utilizing collector 52 as a common collector. In one preferred embodiment of the present invention, the transistor 50, and more particularly the emitter 53 is used as a signal buffer for the signal provided from signal source 54. The second transistor 56 is utilized to heat the transistor 50 when activated by a signal applied from signal source 59. Accordingly, the transistor 56 heats the transistor 50 in order to vary the operational voltage characteristics of transistor 50. This operation serves to compensate for self-heating effects of associated devices in the signal path.

Figure 4:
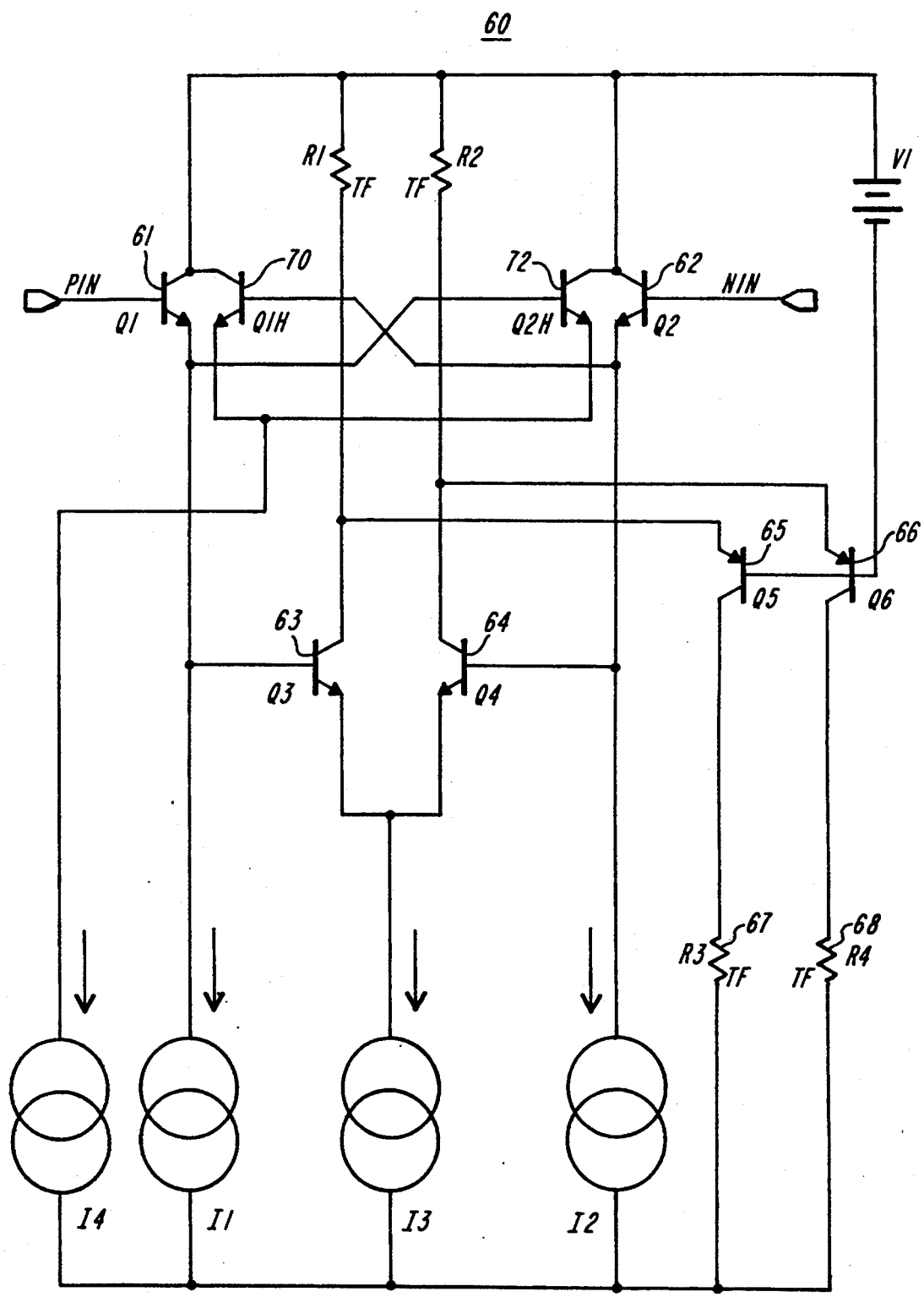
FIG. 4 shows a circuit diagram of a differential input circuit utilizing the present invention.

For illustrative purposes, the present invention will be described in accordance with an application as an input differential gain stage 60 of a comparator device as shown in FIG. 4. A differential input signal to the comparator is applied across inputs PIN and NIN. The input signal is buffered by transistors 61, 62 (Q1 and Q2) and applied to a differential pair, consisting of transistors 63, 64 (Q3 and Q4). The resultant differential current then flows through a folded cascode, consisting of transistors 65, 66 (Q5 and Q6), and induces a differential voltage at the top of resistors 67, 68 (R3 and R4). In the illustration provided, the gain of the first stage is about 13 V/V (differential out/differential in).

A problem occurs if the differential input is fixed at a large value for a significant length of time. For instance, if PIN is raised above NIN by 100 mV, substantially all of the current from current source I3 flows through transistor 63 (Q3), thus causing the transistor 63 (Q3) to warm and the transistor 64 (Q4) to cool. Accordingly, the operational characteristics of transistor 64 (Q4) will be different from transistor 63 (Q3) due to their difference in temperature. When the differential input voltage changes to zero, it will take several thermal time constants ($\tau \approx 3$ to 5 uS) for the transistors 63, 64 (Q3 and Q4) to reach the same temperature, hence, zero offset voltage $V_{os}$.

As described above, the present invention involves creating an extra base-emitter region in the respective collector pockets of transistor 61 (Q1) and transistor 62 (Q2), so as to form heating transistors 70, 72 (Q1H and Q2H). Therefore, if the connections are made as indicated in the schematic of FIG. 4, with the addition of an extra current source I4, the heating transistor 70 (Q1H) will act as a heater so as to alter the emitter temperature of transistor 61 (Q1) in such a manner as to cancel the effects of self-heating of transistor 64 (Q4). The heating transistor 72 (Q2H) will, in the same way, act as a heater for altering the emitter temperature of transistor 62 (Q2) so as to cancel the effects of self-heating of the transistor 63 (Q3).

Several advantages are derived from such a configuration of the present invention. For example, the circuit of the present invention does not change the operating condition of the signal transistors, eg. no modulation of current. In addition the circuit minimizes collector base capacitance of the input devices, since the base region of the input transistors does not change. Furthermore, the configuration minimizes the amount of components required, in this instance the circuit only needed an extra current source and heating transistors.

Figure 5:
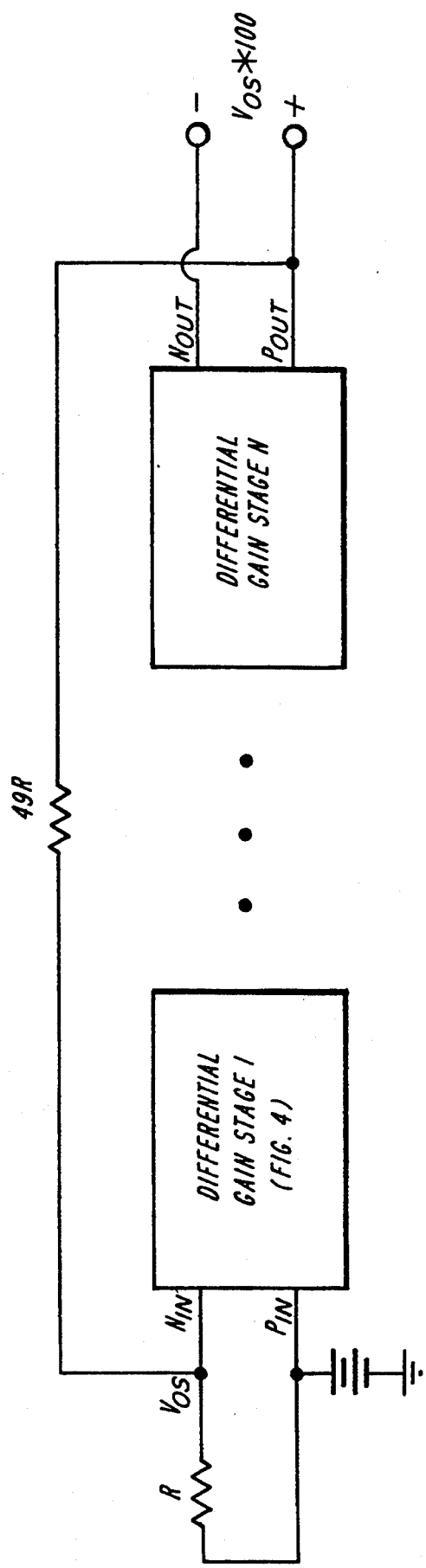
FIG. 5 shows a block diagram of an exemplary differential circuit.

Resulting input offset voltage $V_{os}$ of an exemplary differential circuit shown in FIG. 5 was estimated in simulation tests with and without the heating transistors Q1H and Q2H of the present invention. The exemplary circuit was configured to produce a differential output (Pout-Nout) equal to $V_{os}*100$. The simulation results show that when the differential input is a large fixed voltage, a 4.4 mV $V_{os}$ will result due to device self-heating effects. With the use of present invention, the $V_{os}$ shift, due to self-heating, is reduced to under 1 mV.

Figure 6:
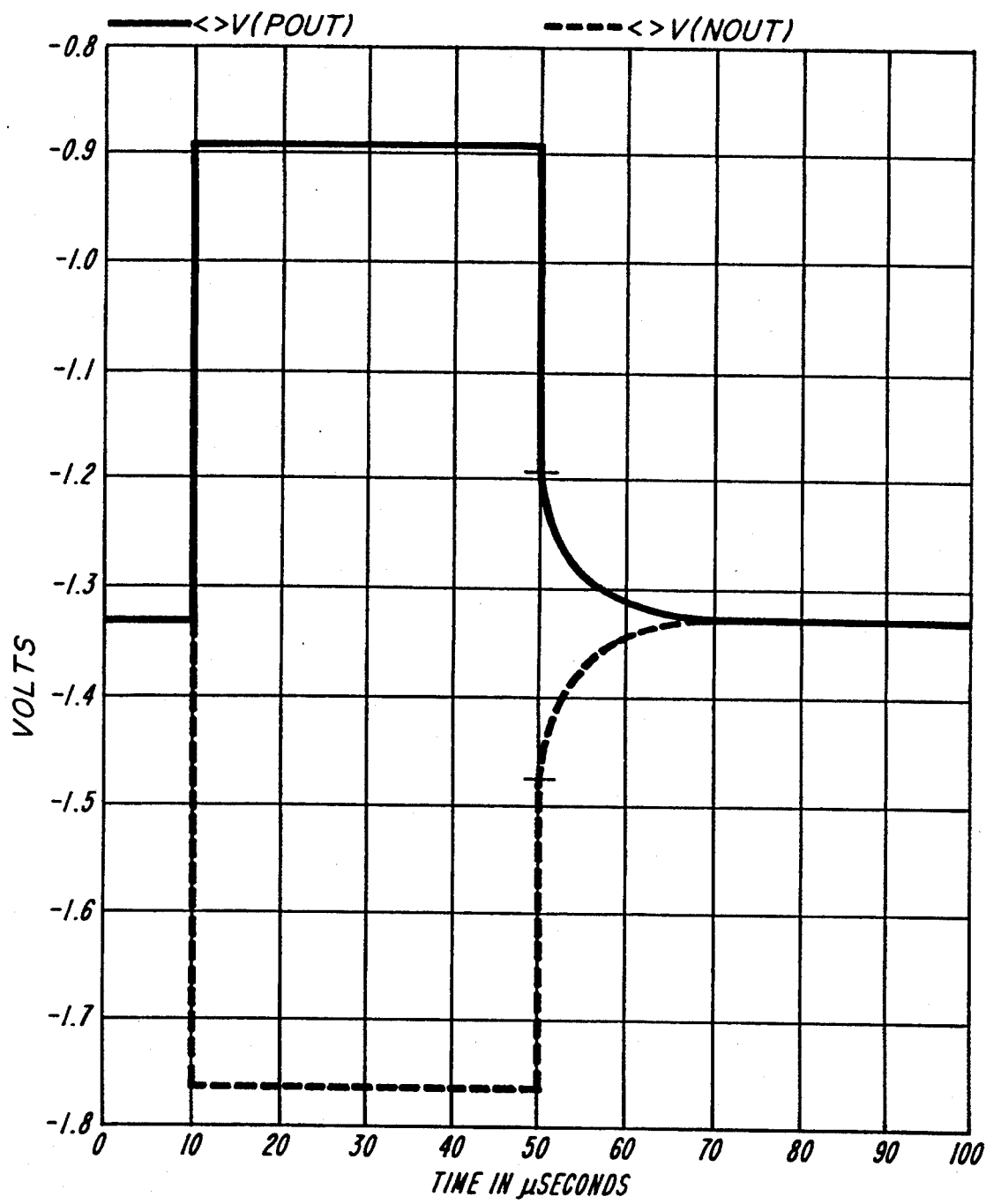
FIGS. 6 and 7 show graphic results of voltage offset measurements in a circuit not utilizing the present invention.
Figure 7:
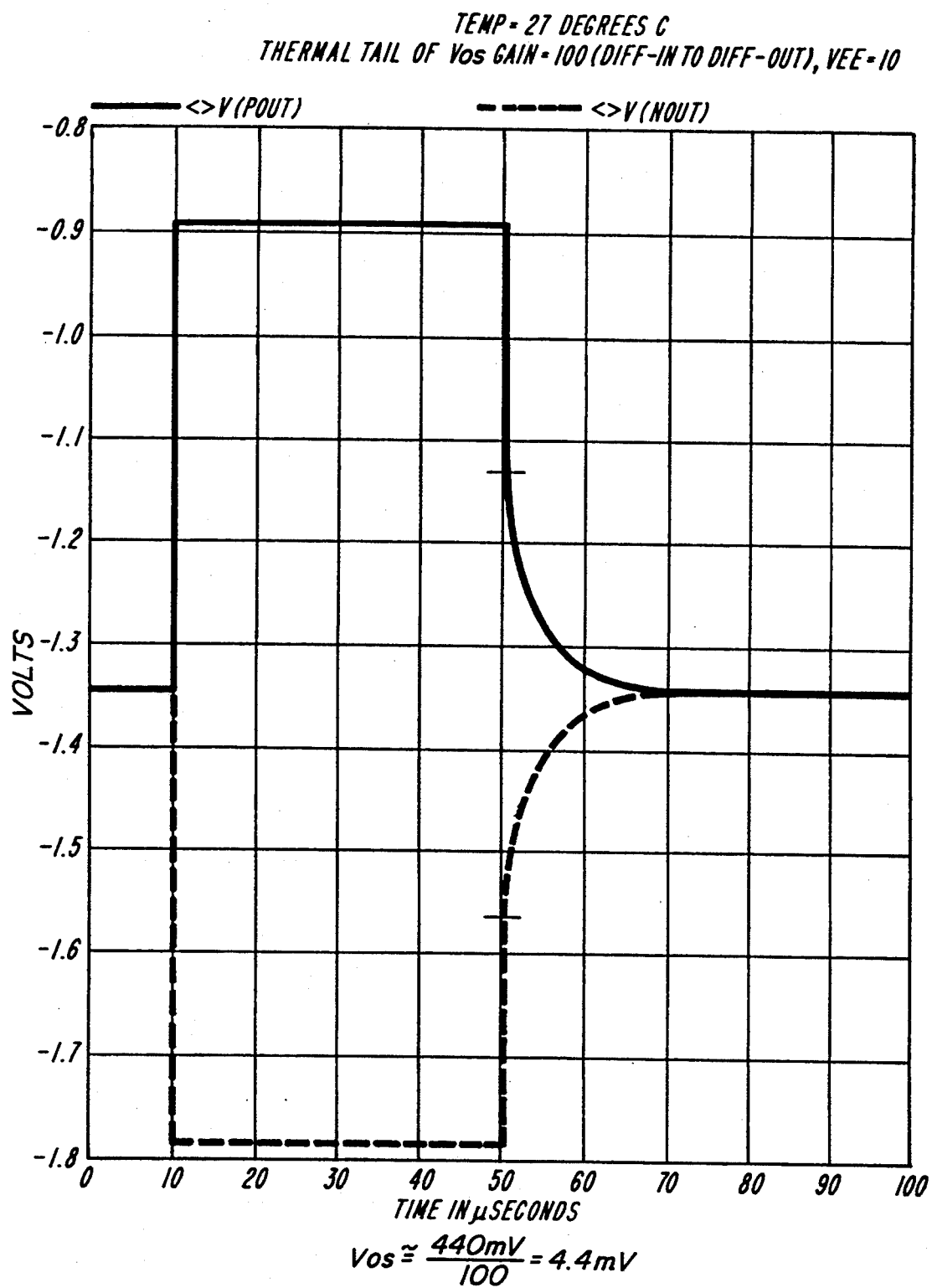

FIGS. 6 and 7 show graphic results, of self-heating, of $V_{os}*100$ when the heating transistors are not utilized.

FIG. 6 shows $V_{os}*100$ when the exemplary differential circuit has a 5V supply and the input is 100 mV (at the input) from 10 uS to 50 uS. Pout-Nout is equal to about 270 mV immediately following the return of the input signal to 0V. Hence, a 2.7 mV offset is induced at the input due to device self-heating. FIG. 7 shows the result when the exemplary differential circuit is running on a 10V supply. The result shows a 4.4 mV offset induced at the input.

Figure 8:
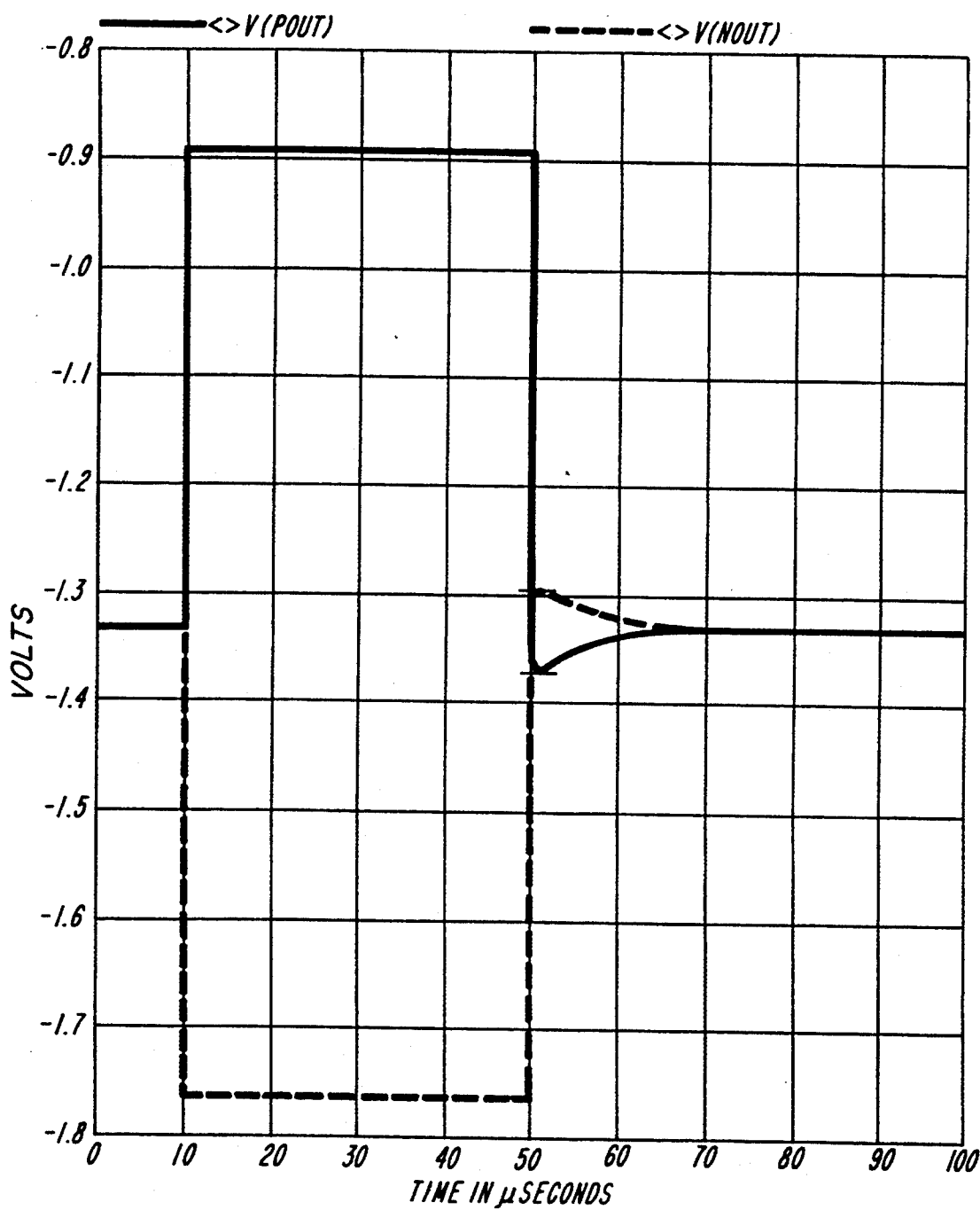
FIGS. 8 and 9 show graphic results of voltage offset measurements in a circuit utilizing the present invention.
Figure 9:
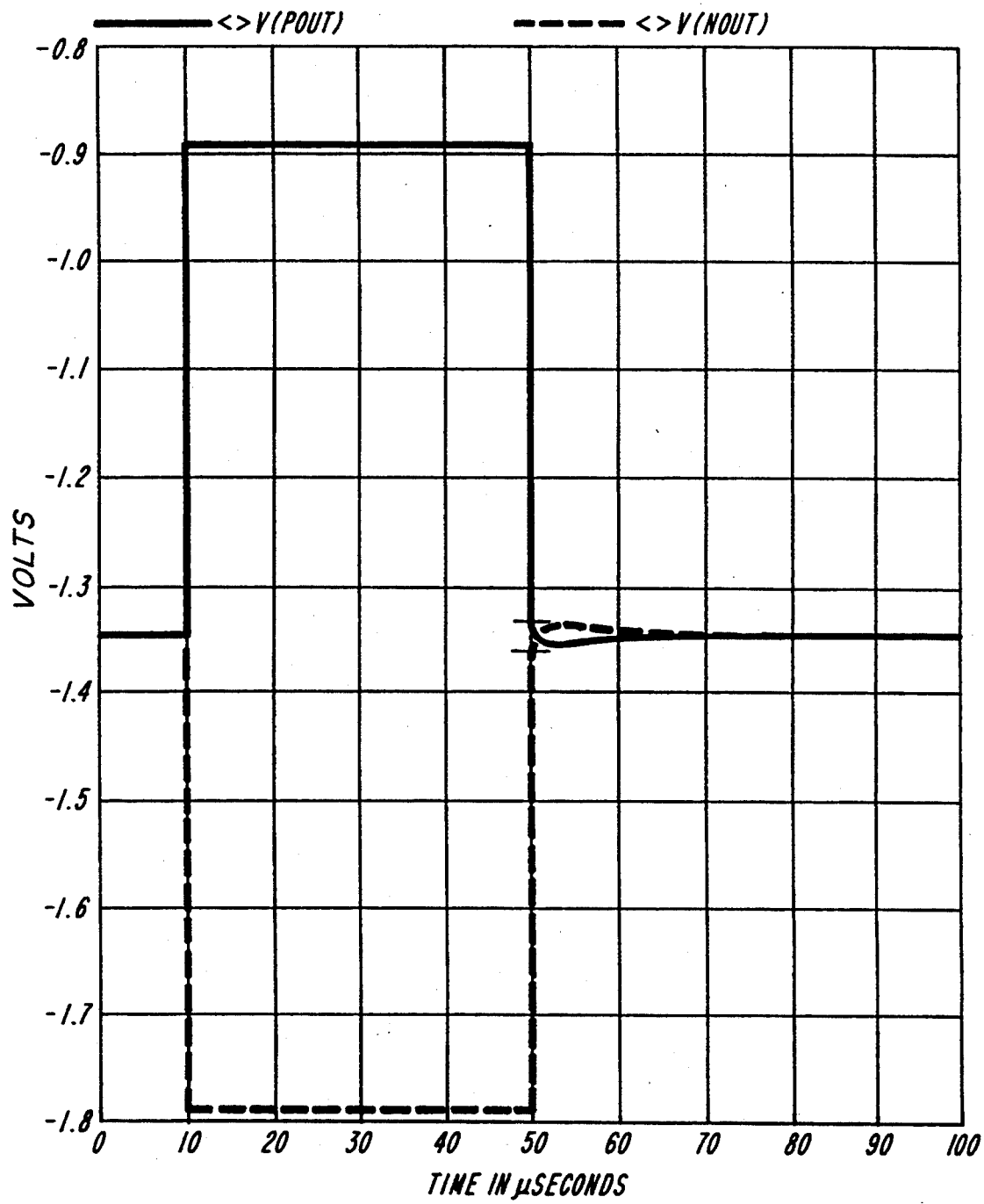

FIGS. 8 and 9 show graphic results of $V_{os}*100$ when the heating transistors Q1H and Q2H are used. FIG. 8 shows the results of the thermal compensation from the heating transistors when the conditions are the same as in FIG. 6. With the heating transistors, only 0.8 mV of offset is induced at the input, compared to 2.7 mV without the compensation. FIG. 9 shows the results of $V_{os}*100$ when the heating transistors are utilized and the conditions are the same as in FIG. 7. Only 0.3 mV of offset is induced at the input, compared to 4.4 mV without the compensation.

The foregoing description has been set forth to illustrate the invention and is not intended to be limiting. Since modifications of the described embodiments incorporating the spirit and substance of the invention may occur to persons skilled in the art, the scope of the invention should be limited soley with reference to the appended claims and equivalents thereof.

We claim:

1. A circuit for varying the temperature of a transistor configured within an isolated electrical region in order to thermally compensate for self-heating effects of an associated device in a common signal path with said transistor, said self-heating effects due to an input signal being applied to said transistor, said circuit comprising:

a heat generator, provided separately from said transistor within said isolated electrical region and adapted to be thermally coupled to said transistor, responsive to said input signal which generates heat which modifies the temperature and in turn the operational electrical characteristics of said transistor so as to minimize shifts in offset voltage.

2. The circuit of claim 1, wherein said transistor comprises a bipolar transistor which utilizes said isolated electrical region as an isolated common collector region.

3. The circuit of claim 2, wherein said heat generator comprises a heating transistor.

4. The circuit of claim 3, wherein said heating transistor comprises a base region and an emitter region adapted to utilize said common collector region.

5. The circuit of claim 4, wherein said heating transistor generates heat in response to being activated.

6. The circuit of claim 4, wherein said isolated common collector region comprises a dielectrically isolated collector region.

7. The circuit of claim 4, wherein said isolated common collector region comprises a junction isolated collector region.

8. The circuit of claim 4, wherein said isolated common collector region comprises a thermally isolated collector region.

9. A circuit for varying the temperature of a first bipolar transistor in order to thermally compensate for self-heating effects of an associated device in a common signal path with said first transistor, said self-heating effects due to an input signal being applied to said first transistor, said first transistor being configured within an isolated collector region, said circuit comprising:

a second bipolar transistor provided within said isolated collector region and thermally coupled to said first transistor, said second transistor responsive to said input signal for providing heat to said first transistor so as to alter the temperature to a predetermined level, thus changing said operational electrical characteristics of said first transistor so as to minimize shifts in offset voltage.

10. The circuit of claim 9, wherein said second transistor comprises a base-emitter region provided within said isolated collector region.

11. The circuit of claim 10, wherein said isolated collector region comprises an electrically isolated collector region.

12. The circuit of claim 11, wherein said isolated collector region comprises a dielectrically isolated collector region.

13. The circuit of claim 11, wherein said isolated collector region comprises a junction isolated collector region.

14. The circuit of claim 10, wherein said isolated collector region comprises a thermally isolated collector region.

15. The circuit of claim 10, wherein said second transistor provides heat to said first transistor in response to being electrically controlled.

16. The circuit of claim 15, wherein said changes in operational electrical characteristics in said first transistor comprise a decrease in base-emitter voltage in accordance with the temperature of said first transistor being increased by said second transistor.

17. A circuit for varying the temperature in a first bipolar transistor in order to thermally compensate for self-heating effects of an associated device in a common signal path with said first transistor, said self-heating effects due to an input signal being applied to said first transistor, said first transistor having a first base region and a first emitter region configured within an isolated collector region, said circuit comprising:

a second base region provided within said isolated collector region; and a second emitter region provided within said second base region to form a second bipolar transistor, said second transistor being thermally coupled to said first transistor, wherein said second transistor is responsive to said input signal to generate heat to said first transistor so as to alter the temperature of said first transistor to a predetermined level, thus shifting the operational voltage characteristics of said first transistor so as to minimize shifts in offset voltage.

18. The circuit of claim 17, wherein said isolated collector region comprises an electrically isolated collector region.

19. The circuit of claim 18, wherein said isolated collector region comprises a dielectrically isolated collector region.

20. The circuit of claim 18, wherein said isolated collector region comprises a junction isolated collector region.

21. The circuit of claim 17, wherein said isolated collector region comprises a thermally isolated collector region.

22. The circuit of claim 17, wherein said second transistor provides heat to said first transistor in response to a power dissipation being induced in said second transistor.

23. The circuit of claim 22, wherein said shifts in operational voltage characteristics in said first transistor comprise a decrease in base-emitter voltage in accordance with the amount of increase in temperature of said first transistor.

24. The circuit of claim 22, wherein said power dissipation is induced in said second transistor in response to being controlled by a third transistor, said third transistor controlling said second transistor in response to receiving a first input signal.

25. The circuit of claim 24, wherein said third transistor includes a base-emitter region configured within a second isolated collector region, and another base-emitter region also configured within said second isolated collector region so as to form a fourth transistor which is thermally coupled to said third transistor, said fourth transistor providing heat to said third transistor in response to power dissipation being induced in said fourth transistor.

26. The circuit of claim 25, wherein said fourth transistor is controlled in response to receiving a second input signal from said first transistor.

27. The circuit of claim 26, wherein said first and second input signals comprise a differential input signal.

28. The circuit of claim 26, wherein said first and third transistors control a differential transistor stage which varies in both temperature and base-emitter voltages in response to said differential input signal.

29. The circuit of claim 28, wherein said second and fourth transistors respectively compensate for temperature induced voltage offsets occurring in said first and third transistors and in said differential transistor stage in response to said differential input signal.

30. A method for varying the temperature in a first bipolar transistor in order to thermally compensate for self-heating effects of an associated device in a common signal path with said first transistor, said self-heating effects due to an input signal being applied to said first transistor, said first transistor having a first base-emitter region provided within an isolated collector region, said method comprising the steps of:

providing a second base-emitter region within said isolated collector region to form a second transistor;

inducing a power dissipation in said second transistor in response to said input signal;

generating heat in response to the power dissipation being induced in said second transistor to alter the temperature of said first transistor and in turn the operational electrical characteristics of said first transistor so as to minimize shifts in offset voltage.

31. A circuit for varying the temperature of first and second bipolar transistors in order to thermally compensate for self-heating effects of respectively associated third and fourth bipolar transistors which form a differential pair in a common signal path with said first and second transistors, said self-heating effects due to a differential input signal being applied to said first and second transistors, said circuit comprising:

fifth and sixth bipolar transistors respectively associated with and thermally coupled to said first and second transistors, said third and sixth transistors being activated in response to said first transistor receiving said input signal, said fourth and fifth transistors being activated in response to said second transistor receiving said input signal, said fifth and sixth transistors operable for providing heat to said first and second transistors, respectively, so as to alter their temperatures to a predetermined level, thus changing said operational electrical characteristics of said first and second transistors so as to minimize shifts in offset voltage.

* * * * *